(12) United States Patent
Uemura

(10) Patent No.: US 7,138,662 B2
(45) Date of Patent: Nov. 21, 2006

(54) LIGHT-EMITTING DEVICE

(75) Inventor: Toshiya Uemura, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/664,081

(22) Filed: Sep. 17, 2003

(65) Prior Publication Data

US 2004/0164310 A1 Aug. 26, 2004

(30) Foreign Application Priority Data

Sep. 18, 2002 (JP) ............................ P2002-271629

(51) Int. Cl.
*H01L 33/00* (2006.01)
(52) U.S. Cl. ............................ 257/98; 257/99; 257/100; 257/E33.065; 257/E33.072
(58) Field of Classification Search .................. 257/99, 257/100, 98
See application file for complete search history.

(56) References Cited

U.S. PATENT DOCUMENTS 4,891,686 A * 1/1990 Krausse, III ................. 174/252

6,515,308 B1 * 2/2003 Kneissl et al. ............... 257/86
2002/0040982 A1 4/2002 Uemura

FOREIGN PATENT DOCUMENTS

| JP | 11-112024 | 4/1999 |
|----|-----------|--------|
| JP | 11-112028 | 4/1999 |
| JP | 11-112034 | 4/1999 |
| JP | 2002-111072 | 4/2002 |

* cited by examiner

*Primary Examiner*—Jerome Jackson
(74) *Attorney, Agent, or Firm*—McGinn IP Law Group, PLLC

(57) ABSTRACT

A light-emitting device including: a semiconductor light-emitting element using a substrate surface as a light-extracting surface; and a mount frame on which the semiconductor light-emitting element is mounted and which has a reflecting portion for reflecting light emitted from the substrate surface; wherein the mount frame has a swollen portion formed so that part of the substrate surface of the light-emitting element is supported by the swollen portion.

27 Claims, 6 Drawing Sheets

LIGHT-EMITTING DEVICE

The present application is based on Japanese Patent Application No. 2002-271629, which is incorporated herein by reference.

BACKGROUND OF THE INVENTION

1. Field of the Invention

The present invention relates to a light-emitting device, preferably having a Group III nitride compound semiconductor light-emitting element mounted.

2. Description of the Related Art

As a related-art light-emitting element based on attention directed to the transparency of a substrate used for a Group III nitride compound semiconductor, there is known a flip chip (hereinafter also abbreviated to "FC") type light-emitting element having a substrate surface on its upper side so that the substrate surface serves as a light-emitting surface. The light-extracting efficiency of the flip chip type light-emitting element is higher than that of a light-emitting element of the type of extracting light from the electrode side (hereinafter also referred to as "FU").

As shown in FIG. 1, interposition of a sub-mount 5 is however essential for mounting the flip chip type light-emitting element 1 on a mount frame 3. A special mount device is further required for mounting the light-emitting element 1 so that the substrate of the light-emitting element 1 turns upward. It is further necessary to deepen a concave portion 4 of the mount frame 3 by at least the height of the sub-mount 5 so that light emitted from the light-emitting element 1 to a side can be reflected toward the optical axis so as to be utilized effectively. This causes increase in production cost of the mount frame 3 and, accordingly, increase in production cost of the light-emitting device.

There has been proposed a light-emitting device in which a downward facing substrate surface of a flip chip type light-emitting element is fixed to a surface of a light-transmissive member with which a concave portion of a mount frame is filled (Related Art 1).

There has been proposed a light-emitting device having a light-emitting element of the type of extracting light from the electrode side, in which a reflecting block is protruded from a bottom surface of a mount frame (Related Art 2).

In the light-emitting device according to Related Art 1, the light-emitting element having a substrate surface as a main light-emitting surface can be mounted without use of any sub-mount. Accordingly, an inexpensive light-emitting device can be provided while the light-emitting efficiency of the light-emitting element is kept high. According to the inventors' examination, however, the following problem to be solved has been found.

That is, it is difficult to give the light-transmissive member heat conductivity sufficient to release heat caused by light emission. As a result, when a high-output light-emitting element is mounted, there is a possibility that the life of the light-emitting element may be shortened because of insufficient heat radiation.

It is also difficult to give the light-transmissive member sufficient mechanical stiffness. Accordingly, there is fear in the mount stability of the light-emitting element. When, for example, wire bonding is performed by high-frequency heating after the light-emitting element is fixed to the light-transmissive member, there is a possibility that vibration may be absorbed to the light-transmissive member to make the wire bonding impossible. Accordingly, there is a possibility that the quality of the light-emitting device may vary.

In the light-emitting device according to Related Art 2, a light-emitting element having a main light-emitting surface on the electrode surface side is used. This type light-emitting element is structurally inferior in light-emitting output to a light-emitting element having a main light-emitting surface on the substrate surface side. One of reasons is light shielding of a bonding electrode and low light transmittance of a light-transmissive electrode. When a light-transmissive thin-film electrode as used in the light-emitting device according to Related Art 2 is used, deterioration (ball-up) of the thin-film electrode per se or deterioration (ball-up) of the thin-film electrode at a junction surface between the thin-film electrode and a seat electrode occurs as the amount of heat generated in the light-emitting element increases.

As described above, the light-emitting device according to Related Art 2 includes the problem (in difficulty in obtaining a high output from the light-emitting element, and low light-extracting efficiency) which has been already solved in Related Art 1.

SUMMARY OF THE INVENTION

The invention is developed to further improve the light-emitting device according to Related Art 1 and an object of the invention is to provide a light-emitting device in which a light-emitting element can be mounted stably as well as the light-emitting device is excellent heat-radiating characteristic.

To achieve the foregoing object, the invention provides a light-emitting device configured as follows.

A light-emitting device including: a semiconductor light-emitting element using a substrate surface as a light-extracting surface; and a mount frame on which the semiconductor light-emitting element is mounted and which has a reflecting portion for reflecting light emitted from the substrate surface; wherein the mount frame has a swollen portion formed within the reflecting portion so that part of the substrate surface is supported by the swollen portion to thereby mount the light-emitting element on the mount frame.

According to the light-emitting device configured as described above, because the substrate surface of the light-emitting element is supported by the swollen portion of the mount frame, heat generated in the light-emitting element can be released to the mount frame through the swollen portion. Accordingly, heat-radiating characteristic is improved compared with the configuration of Related Art 1, so that durability of the light-emitting element or the light-emitting device is improved. Because the substrate is supported by the swollen portion, mount stability is also improved. Accordingly, the quality of the light-emitting device is stabilized from this point of view.

DETAILED DESCRIPTION OF THE PREFERRED EMBODIMENTS

Figure 1:
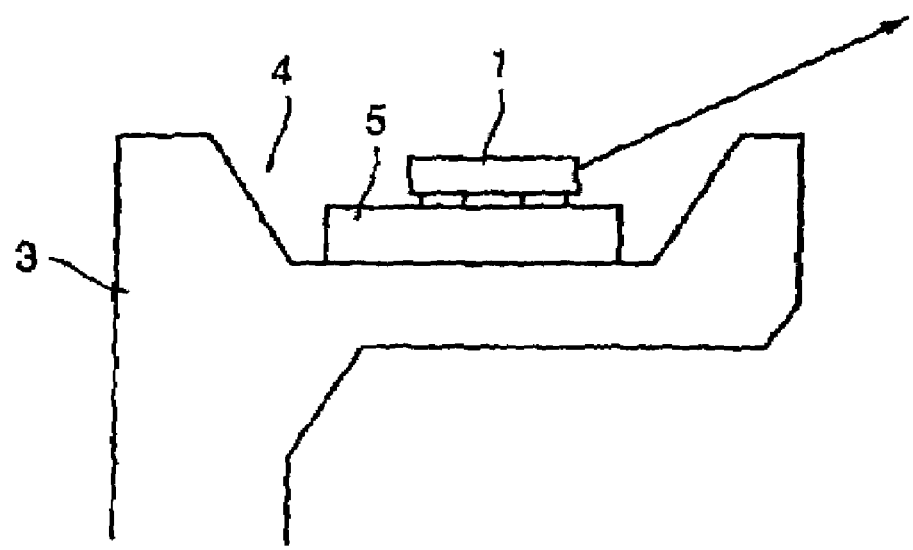
FIG. 1 is a sectional view typically showing the configuration of a related-art light-emitting device having a flip chip type light-emitting element mounted.

Respective constituent members of the invention will be described below. (Group III Nitride Compound Semiconductor Light-Emitting Element)

Group III nitride compound semiconductors are represented by the general formula $Al_xGa_yIn_{1-x-y}N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<_1$ each). At least part of the Group III elements may be replaced by boron (B), thallium (Tl), etc. At least part of the nitrogen (N) may be replaced by phosphorus (P), arsenic (As), antimony (Sb), bismuth (Bi), etc. Layers of such Group III nitride compound semiconductors are laminated to form a light-emitting element. A quantum well structure (multiple quantum well structure or single quantum well structure) of Group III nitride compound semiconductors, a single hetero type structure, a double hetero type structure, a homo-junction type structure, etc. may be used as a layer configuration for emitting light.

Each Group III nitride compound semiconductor may contain any dopant. Silicon (Si), germanium (Ge), selenium (Se), tellurium (Te), carbon (C), etc. maybe used as n-type impurities. Magnesium (Mg), zinc (Zn), beryllium (Be), calcium (Ca), strontium (Sr), barium (Ba), etc. may be used as p-type impurities.

Each Group III nitride compound semiconductor may be formed by a metal organic chemical vapor deposition method (MOCVD method) or may be formed by a known method such as a molecular beam epitaxy method (MBE method), a halide vapor-phase epitaxy method (HVPE method), a sputtering method, or an ion-plating method.

The material of the substrate used for growing a Group III nitride compound semiconductor layer is not particularly limited if the Group III nitride compound semiconductor layer can be grown on the substrate as well as light emitted from a light-emitting layer can be transmitted through the substrate. Examples of the material of the substrate include sapphire, spinel, zirconium boride, silicon carbide, zinc oxide, magnesium oxide, manganese oxide, and Group III nitride compound semiconductor single crystal. Especially, a sapphire substrate is preferably used. A face a of the sapphire substrate is more preferably used.

The color of light emitted from the light-emitting element can be selected suitably according to the purpose. For example, blue, red, green, etc. can be selected in accordance with a required color of emitted light. A plurality of light-emitting elements may be used. In this case, it a matter of course that light-emitting elements of the same kind may be used in combination and that different kinds of light-emitting elements may be used in combination. For example, three kinds of light-emitting elements capable of emitting light with red, green and blue which are the three primary colors of light may be used in combination. According to this configuration, a light-emitting device capable of emitting light with an arbitrary color can be formed.

The semiconductor light-emitting element installed in the light-emitting device according to the present invention is not limited to the Group III nitride compound semiconductor light-emitting element and another type of the light-emitting element can be installed.

(Electrodes)

In the light-emitting element, a p electrode needs to be in ohmic contact with a p-type semiconductor layer. In the invention applied to a flip chip type light-emitting element, the p electrode needs to have high reflectance. Accordingly, at least one metal selected from the group consisting of Rh, Pt and Ru or an alloy of the metal may be preferably used as the material of a portion (junction layer) joined to the p-type semiconductor layer. Especially, Rh may be more preferably used.

The junction layer is preferably laminated so that an as-large-as-possible area of a surface of the p-type semiconductor layer can be covered with the junction layer. This is for the purpose of injecting a uniform current into the p-type semiconductor layer to thereby reflect a large part of light emitted from the light-emitting layer. The film thickness of the junction layer is preferably selected to be in a range of from 50 nm to 1000 nm.

The junction layer may be preferably covered with an Au-containing layer so that up to a side surface of the junction layer can be surrounded by the Au-containing layer. The junction layer is an important layer joined to a semiconductor layer. The junction layer is provided for the purpose of preventing variation in contact resistance and keeping reflectance at an interface stable.

To cover the whole of the junction layer for this purpose, the material must be a thick film. Accordingly, Au, which is a material easy to form such a thick film and stable, is preferably selected. The film thickness of the Au-containing layer is preferably selected to be in a range of from 100 nm to 2000 nm.

A first adhesive layer may be preferably provided between the Au-containing layer and the junction layer. At least one metal selected from the group consisting of Ti, V, W, Mo and Ta or an alloy of the metal may be used as the material for forming the first adhesive layer. The film thickness of the first adhesive layer is preferably selected to be in a range of from 5 nm to 100 nm.

A second adhesive layer may be preferably provided on the uppermost layer so that adhesion to an electrically insulating protective film which will be described later can be improved. At least one metal selected from the group consisting of Al, Ti, Cr, V, W and Mo or an alloy of the metal may be used as the material for forming the second adhesive layer. Especially, Al or its alloy may be preferably used. The film thickness of the second adhesive layer is preferably selected to be in a range of from 3 nm to 100 nm.

A metal such as Al, V, Sn, Rh, Ti, Cr, Nb, Ta, Mo, W, or Hf, or an alloy of two or more metals selected from these metals may be used as the material of an n electrode joined to an n-type semiconductor layer. Especially, a two-layer structure of V and Al viewed from the semiconductor layer side maybe preferably provided as a junction layer. A first adhesive layer, an Au-containing layer and a second adhesive layer may be preferably provided in the same manner as in the p electrode.

Each of the metal layers forming these electrodes can be formed by a vapor deposition method, a sputtering method, or any other method.

An electrically insulating layer may be preferably provided so that a leakage current can be prevented from flowing between the electrodes as well as the electrodes except partial regions can be covered and protected.

A plurality of bonding wires may be preferably connected to the p electrode. Accordingly, a large amount of heat can be released through the bonding wires, so that durability of the light-emitting element is improved. Incidentally, in the flip chip type light-emitting element, because a reflective p electrode is used, there is no influence on the efficiency in extracting light from the light-emitting element even in the case where a plurality of bonding pads are provided. On the other hand, in a light-emitting element of the type using a light-transmissive p electrode, a plurality of bonding wires cannot be provided from the point of view of the light-extracting efficiency because the bonding pads are opaque.

(Mount Frame)

The mount frame has a reflecting portion for reflecting light emitted from the substrate surface (main light-emitting surface) of the light-emitting element. For example, a cup-like portion for surrounding sides of the light-emitting element may be used as the reflecting portion. The term "cup-like portion" used herein means a portion having a space shaped such that the area of a section perpendicular to the optical axis increases continuously or stepwise as the position of the section goes from the bottom side toward the light-extracting side of the light-emitting device. If this condition is satisfied, the shape of the inner circumferential surface of the reflecting portion forming the cup-like portion is not particularly limited.

The material for forming the reflecting portion is not particularly limited. A suitable material selected from a metal, an alloy, a synthetic resin, etc. can be used. However, a surface facing the substrate of the light-emitting element in a state in which the light-emitting element is mounted, that is, a reflecting surface needs to be reflective to light emitted from the light-emitting element. Therefore, when a material which does not exhibit high reflectance to light emitted from the light-emitting element is used as the material of the mount frame, a high-reflectance layer needs to be formed on a surface of a region serving at least as the reflecting surface. For example, the reflecting layer can be formed of at least one metal selected from the group consisting of Al, Ag, Cr, Pd and Rh or an alloy of the metal. Alternatively, metal nitride such as titanium nitride, hafnium nitride, zirconium nitride, or tantalum nitride may be used as the material of the reflecting layer. Especially, the reflecting layer may be preferably formed of Al or its alloy, or Ag or its alloy. A surface of the reflecting layer may be coated with a fluororesin such as Teflon (trade name) or with a white material such as particles of barium sulfate. A method such as vapor deposition, painting, printing or spraying can be used for forming the reflecting layer. Particularly, according to the vapor deposition method, a reflecting layer uniform in thickness and having a smooth surface can be formed easily.

The reflecting surface is preferably as smooth as possible. This is because, as the reflecting surface becomes smoother, mirror reflection occurs more frequently in the reflecting surface to thereby attain improvement of reflecting efficiency and, accordingly, improvement of light-emitting efficiency.

(Swollen Portion)

The swollen portion is formed in the reflecting portion of the mount frame.

The swollen portion is preferably formed so as to be integrated with the mount frame in order to reduce production cost. The mount frame is formed of a metal material (copper, iron, stainless steel, etc.) having electric conductivity and excellent in heat-radiating characteristic. When the swollen portion is formed of such a metal material, the swollen portion forms a heat path between the light-emitting element and the mount frame. Accordingly, heat can be released from the light-emitting element to the outside efficiently, so that the life of the light-emitting element is elongated.

The swollen portion also has a function of supporting the light-emitting element. To support the light-emitting element stably, it is preferable that a top portion of the swollen portion is flattened as well as mechanical stiffness is required of the swollen portion.

A plurality of swollen portions may be formed.

The swollen portion may be formed separately from the mount frame. In this case, a metal material high in heat conductivity is preferably selected as the material for forming the swollen portion.

Because the swollen portion is formed in the reflecting portion of the mount frame, it is necessary to consider interference with light emitted from the light-emitting element to the reflecting portion.

The swollen portion is preferably provided as a rotationally symmetric member erected at nearly the center of the reflecting portion so that the distribution of light in the reflecting portion is made uniform. The axis of the swollen portion is made coincident with the optical axis of the reflecting portion.

An inclined surface is preferably formed in the swollen portion. Light emitted from the light-emitting element can be reflected to a side surface of the reflecting portion (cup-like portion) of the mount frame efficiently by the inclined surface, so that the light-extracting efficiency of the light-emitting device is improved.

From this point of view, the swollen portion is preferably shaped like a cone and further preferably shaped like a truncated cone.

The substrate of the light-emitting element is fixed to the swollen portion through an adhesive agent. A light-transmissive material such as an epoxy resin, a polyester resin or a silicone resin may be preferably used as the adhesive agent. A material used for general purpose such as silver paste may be also used as the adhesive agent.

Incidentally, when a light-transmissive material is used, the light-transmissive material can be applied on an upper surface of the swollen portion as well as the cup-like portion forming the reflecting portion can be filled with the light-transmissive material to thereby support and fix the light-emitting element. When a non-light-transmissive material such as silver paste is used, it is preferable from the point of view of the light-extracting efficiency that the material is applied on only the upper surface of the swollen portion as restrictively as possible.

To ensure stability in the swollen portion's supporting the light-emitting element, it is preferable that the position of the center of gravity of the light-emitting element is supported by the swollen portion. That is, the center (located in the inside of the light-emitting element when viewed three-dimensionally) of gravity of the light-emitting element is located above the swollen portion.

Incidentally, the cup-like portion forming the reflecting portion is preferably filled with the light-transmissive material in advance so that the light-emitting element can be fixed both to the light-transmissive material and to the swollen portion. In the related art, the light-emitting element was fixed on the light-transmissive material. On the contrary, in the invention, the swollen portion is added to thereby improve stability.

Figure 10:
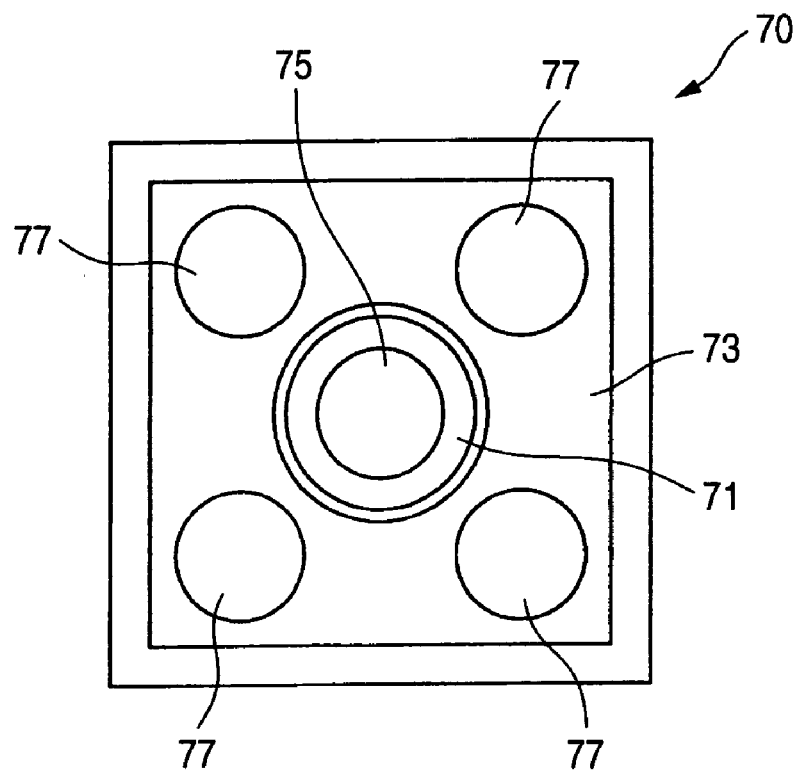
FIG. 10 is a plan view of a light-emitting element according to another embodiment of the invention.

In the light-emitting element, a portion where the p electrode is formed serves as a region that substantially emits light. In the light-emitting element, a portion being in contact with the swollen portion through the adhesive agent does not substantially reflect light. It is therefore preferable that the position of the center of gravity of the p electrode in the light-emitting element is supported by the swollen portion in order to keep balance of light emission. That is, the center of gravity of the p electrode is located above the swollen portion. As shown in FIG. 10, the center of gravity of the p electrode need not be located in the inside of the p electrode.

The position of the center of gravity of the p electrode need not coincide with the position of the center of gravity of the light-emitting element. Even in the case where the swollen portion is displaced from the position of the center of gravity of the light-emitting element, stability can be improved compared with the related art (in which the light-emitting element was supported by the light-transmissive material) using no swollen portion.

To prevent light from being blocked with the swollen portion, it is preferable that the swollen portion is disposed below the n electrode.

A material transparent to light emitted from the light-emitting element and excellent in durability, weather resistance, etc. is preferably used as the light-transmissive material with which the cup-like portion is filled. For example, a suitable material can be selected from silicone (including silicone resin, silicone rubber, and silicone elastomer), epoxy resin, urea resin, and glass in accordance with the wavelength of light emitted from the light-emitting element. When light emitted from the light-emitting element contains short-wave light, a material such as silicone high in ultraviolet degradation resistance is preferably used because ultraviolet degradation becomes an issue in this case particularly.

A plurality of layers made of different materials may be used as the light-transmissive material.

The light-transmissive material may contain a fluorescent substance. When the fluorescent substance is used, the wavelength of part of light emitted from the light-emitting element can be changed differently so that the luminescent color of the light-emitting device can be changed or corrected. Any fluorescent substance may be used if the fluorescent substance can be excited by light emitted from the light-emitting element. The luminescent color, durability, etc. of the light-emitting device may be considered for the selection of the fluorescent substance. The fluorescent substance may be dispersed into the light-transmissive material evenly or may be localized into a partial region of the light-transmissive material. When, for example, the fluorescent substance is localized in a neighbor of the light-emitting element, the fluorescent substance can be efficiently irradiated with light emitted from the light-emitting element.

A plurality of kinds of fluorescent substances may be used in combination so as to be contained in the light-transmissive material. In this case, a fluorescent substance of the type capable of generating fluorescence when excited by light emitted from the light-emitting element and a fluorescent substance of the type capable of generating fluorescence when excited by fluorescence generated from the fluorescent substance may be used in combination.

A light-diffusing agent may be contained in the light-transmissive material so that diffusion of light in the light-transmissive material can be promoted to attain reduction in unevenness of light emission. Particularly, in the configuration using the fluorescent substance, it is preferable that such a light-diffusing agent is used for promoting color mixing of light emitted from the light-emitting element and fluorescence generated from the fluorescent substance to thereby reduce unevenness of the luminescent color of the light-emitting device.

(Sealing Member)

The sealing member is a member which is formed so that the light-emitting element is covered with the member. The sealing member is provided mainly for the purpose of protecting the light-emitting element from the external environment. A material transparent to light emitted from the light-emitting element and excellent in durability, weather resistance, etc. may be preferably used as the material of the sealing member. For example, a suitable material can be selected from silicone (including silicone resin, silicone rubber, and silicone elastomer), epoxy resin, urea resin, and glass in accordance with the wavelength of light emitted from the light-emitting element. When light emitted from the light-emitting element contains short-wave light, a material such as silicone high in ultraviolet degradation resistance is preferably used because ultraviolet degradation becomes an issue in this case particularly.

The material of the sealing member can be selected in consideration of transmittance to light emitted from the light-emitting element, hardness in a cured state, handling property, etc.

A plurality of layers made of different materials may be provided as the sealing member so as to be laminated on the light-emitting element.

The sealing member may contain a fluorescent substance. When the fluorescent substance is used, the wavelength of part of light emitted from the light-emitting element can be changed differently so that the luminescent color of the light-emitting device can be changed or corrected. Any fluorescent substance may be used if the fluorescent substance can be excited by light emitted from the light-emitting element. The luminescent color, durability, etc. of the light-emitting device maybe considered for the selection of the fluorescent substance. The fluorescent substance may be dispersed into the sealing member evenly or may be localized into a partial region of the sealing member. When, for example, the fluorescent substance is localized in a neighbor of the light-emitting element, the fluorescent substance can be efficiently irradiated with light emitted from the light-emitting element.

A plurality of kinds of fluorescent substances may be used in combination so as to be contained in the sealing member. In this case, a fluorescent substance of the type capable of generating fluorescence when excited by light emitted from the light-emitting element and a fluorescent substance of the type capable of generating fluorescence when excited by fluorescence generated from the fluorescent substance may be used in combination.

A light-diffusing agent may be contained in the sealing member so that diffusion of light in the sealing member can be promoted to attain reduction in unevenness of light emission. Particularly, in the configuration using the fluorescent substance, it is preferable that such a light-diffusing agent is used for promoting color mixing of light emitted from the light-emitting element and fluorescence generated from the fluorescent substance to thereby reduce unevenness of the luminescent color of the light-emitting device.

Embodiments of the invention will be described below.

Figure 2:
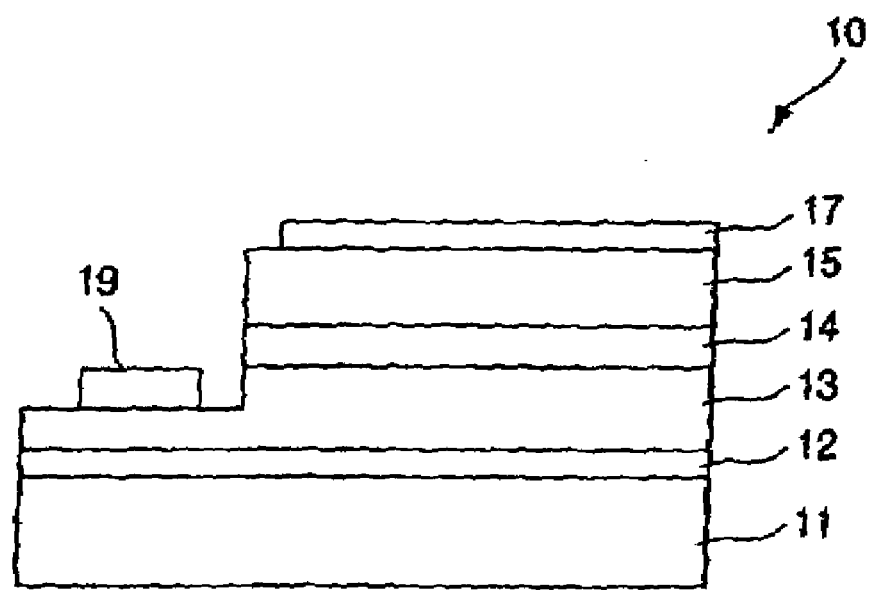
FIG. 2 is a sectional view typically showing the layer configuration of a light-emitting element in an embodiment of the invention.

FIG. 2 is a sectional view typically showing a light-emitting element 10 used in an embodiment of the invention. Specifications of respective layers in the light-emitting element 10 are as follows.

| Layer | Composition |
|---|---|
| p-type layer 15 | p-GaN:Mg |
| Light-emitting layer-containing layer 14 | containing InGaN layer |
| n-type layer 13 | n-GaN:Si |
| Buffer layer 12 | AlN |
| Substrate 11 | sapphire |

An n-type layer 13 made of GaN doped with Si as n-type impurities is formed on a substrate 11 through a buffer layer 12. Although this embodiment shows the case where sapphire is used as the substrate 11, the invention is not limited thereto. For example, sapphire, spinel, gallium nitride, zirconium boride, silicon carbide, zinc oxide, magnesium oxide, manganese oxide, or Group III nitride compound semiconductor single crystal may be used as the substrate 11. Although this embodiment shows the case where the buffer layer 12 is formed of AlN by an MOCVD method, the invention is not limited thereto. For example, GaN, InN, AlGaN, InGaN, or AlInGaN may be used as the material of the buffer layer 12. A molecular beam epitaxy method (MBE method), a halide vapor-phase epitaxy method (HVPE method), a sputtering method, or an ion-plating method may be used as the method for producing the buffer layer 12. When a Group III nitride compound semiconductor is used as the substrate 11, the buffer layer 12 can be dispensed with.

After the formation of the semiconductor element 10, the substrate 11 and the buffer layer 12 maybe removed if necessary.

Although this embodiment shows the case where the n-type layer 13 is made of GaN, the invention may be also applied to the case where the n-type layer 13 is made of AlGaN, InGaN or AlInGaN.

Although this embodiment shows the case where the n-type layer 13 is doped with Si as n-type impurities, the invention may be also applied to the case where Ge, Se, Te, C or the like is used as n-type impurities.

The light-emitting layer-containing layer 14 may include a quantum well structure (multiple quantum well structure or single quantum well structure). A single hetero type structure, a double hetero type structure, a homo-junction type structure, etc. maybe used as the structure of the light-emitting element.

The light-emitting layer-containing layer 14 may contain a Group III nitride compound semiconductor layer disposed on the p-type layer 15 side, doped with Mg or the like and having a wide band gap. This is provided for effectively preventing electrons injected into the light-emitting layer-containing layer 14 from diffusing into the p-type layer 15.

A p-type layer 15 made of GaN doped with Mg as p-type impurities is formed on the light-emitting layer-containing layer 14. Alternatively, the p-type layer 15 may be made of AlGaN, InGaN or InAlGaN. Zn, Be, Ca, Sr or Ba may be used as p-type impurities. After introduction of the p-type impurities, resistance may be reduced by a known heating method such as electron beam irradiation, heating in a furnace, or plasma irradiation.

In the light-emitting element configured as described above, each Group III nitride compound semiconductor layer may be formed by MOCVD executed in a general condition or may be formed by a method such as a molecular beam epitaxy method (MBE method), a halide vapor-phase epitaxy method (HVPE method), a sputtering method, or an ion-plating method.

An n electrode 19 has two layers of Al and V. After the p-type layer 15 is formed, the p-type layer 15, the light-emitting layer-containing layer 14 and the n-type layer 13 are partially removed by etching. The n electrode 19 is formed on an exposed portion of the n-type layer 13 by vapor deposition.

A p electrode 17 has a junction layer of Rh formed on the p-type layer 15, and a layer of Au for surrounding the junction layer. Each layer is formed by vapor deposition.

Figure 3:
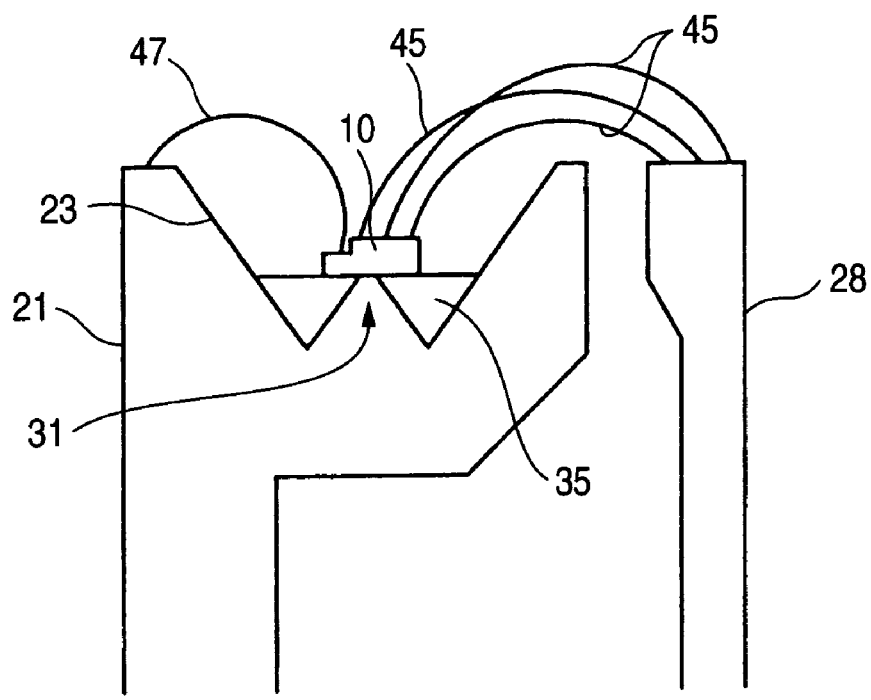
FIG. 3 is a sectional view showing a state in which leads are attached to the light-emitting element in the embodiment of the invention.
Figure 4:
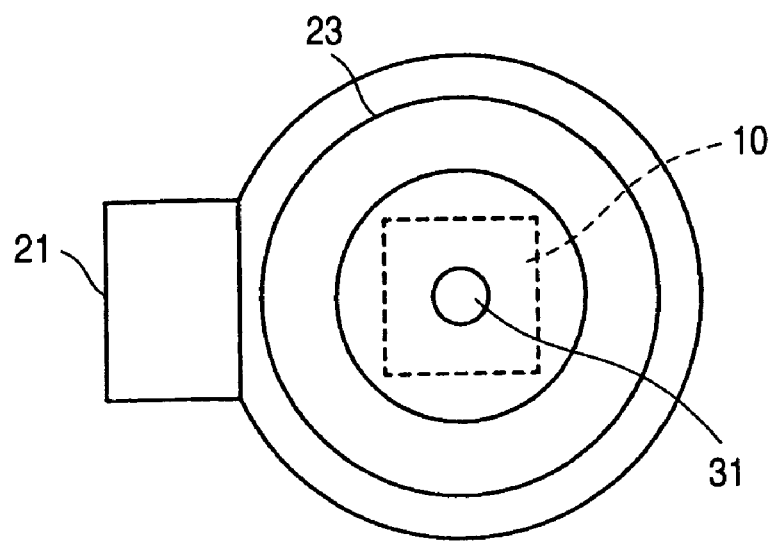
FIG. 4 is a plan view of a mount lead.
Figure 5:
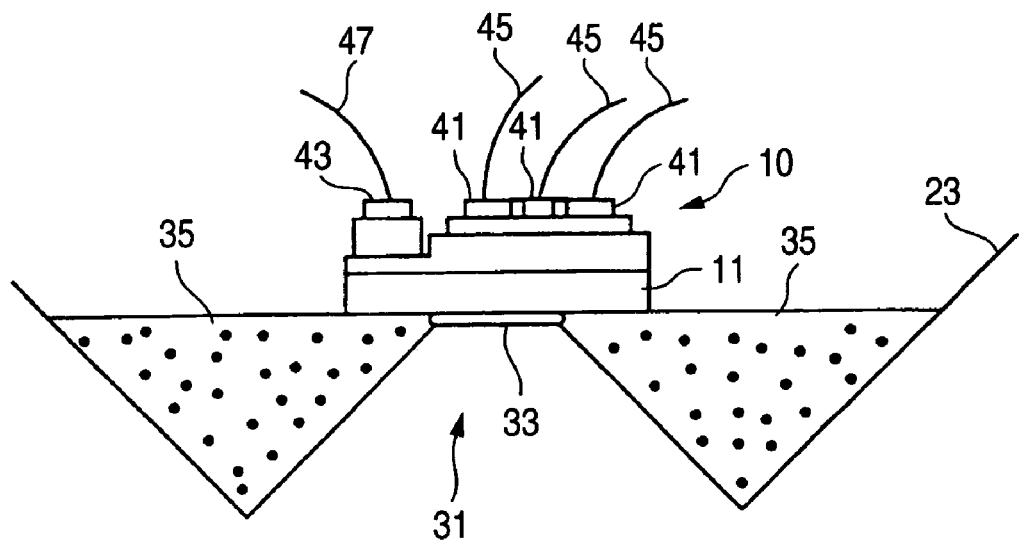
FIG. 5 is a partly enlarged view of FIG. 3.
Figure 6:
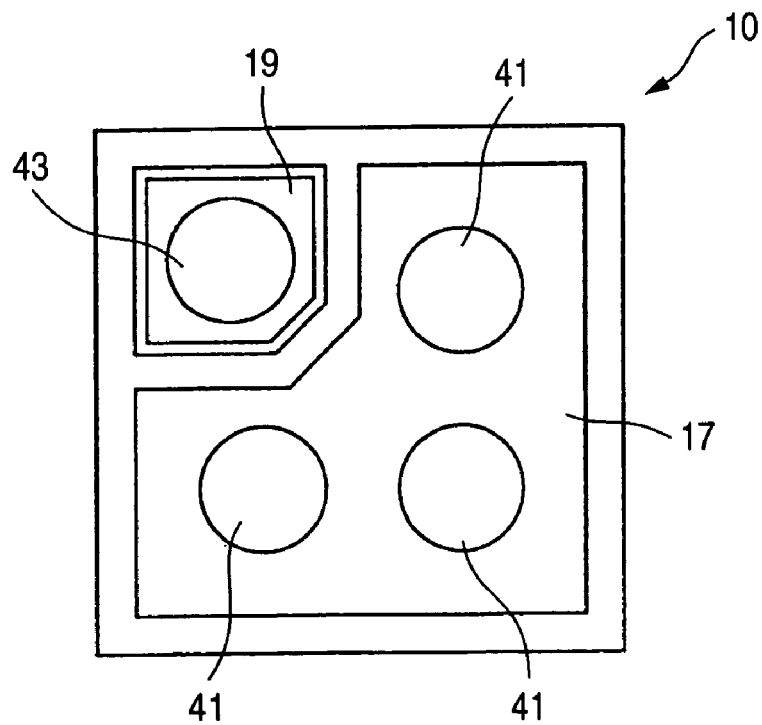
FIG. 6 is a plan view of a light-emitting element.

FIG. 3 shows a state in which the light-emitting element 10 is mounted on a mount frame 21. FIG. 4 is a plan view of the mount frame 21. FIG. 5 is an enlarged view of FIG. 4. FIG. 6 is a plan view showing the positions of bonding balls relative to the light-emitting element 10.

In FIG. 3, the mount frame 21 made of iron has a cup-like portion 23 having an Ag-plated surface. The inner surface of the cup-like portion 23 is processed as a mirror surface to form a reflecting portion. A swollen portion 31 shaped like a truncated cone is provided so as to be erected from the center of a bottom surface of the cup-like portion 23. A circumferential surface of the swollen portion 31 is also processed as a mirror surface. A nearly central portion of the substrate of the light-emitting element 10 (i.e., the position of the center of gravity of the element) is fixed to a top portion of the swollen portion 31 through silver paste 33. A lower portion of the cup-like portion 23 than the light-emitting element 10 is filled with a fluorescent substance 35. The fluorescent substance 35 is prepared by dispersing a fluorescent material in to a light-transmissive material. The fluorescent substance 35 absorbs light emitted from the light-emitting element 10 and generates fluorescence as light having a wavelength longer than the wavelength of the light emitted from the light-emitting element 10. A resin material such as an epoxy resin or an inorganic material such as glass may be used as the light-transmissive material. When an epoxy resin or the like is used as the light-transmissive material, the epoxy resin or the like may be used also as an adhesive agent between the swollen portion 31 and the light-emitting element 10. Even in the case where an adhesive layer is formed between the substrate 11 of the light-emitting element 10 and the swollen portion 31, the light-emitting element 10 can be supported by the swollen portion 31 stably because the film thickness of the adhesive layer is small. In addition, the thin adhesive layer does not disturb heat radiation because the thin adhesive layer is low in heat resistance.

In this embodiment, as shown in FIG. 6, three bonding balls 41 are formed on the p electrode 17 and one bonding ball 43 is formed on then electrode 19 in the light-emitting element 10 fixed on the swollen portion 31 in the aforementioned manner. That is, three bonding wires 45 are laid between the p electrode 17 and a lead 28, and one bonding wire 47 is laid between the n electrode 19 and a mount lead 21. Heat generated in the light-emitting element is radiated to the mount lead 21 and the lead 28 through these bonding wires 45 and 47 surely and efficiently.

Figure 7:
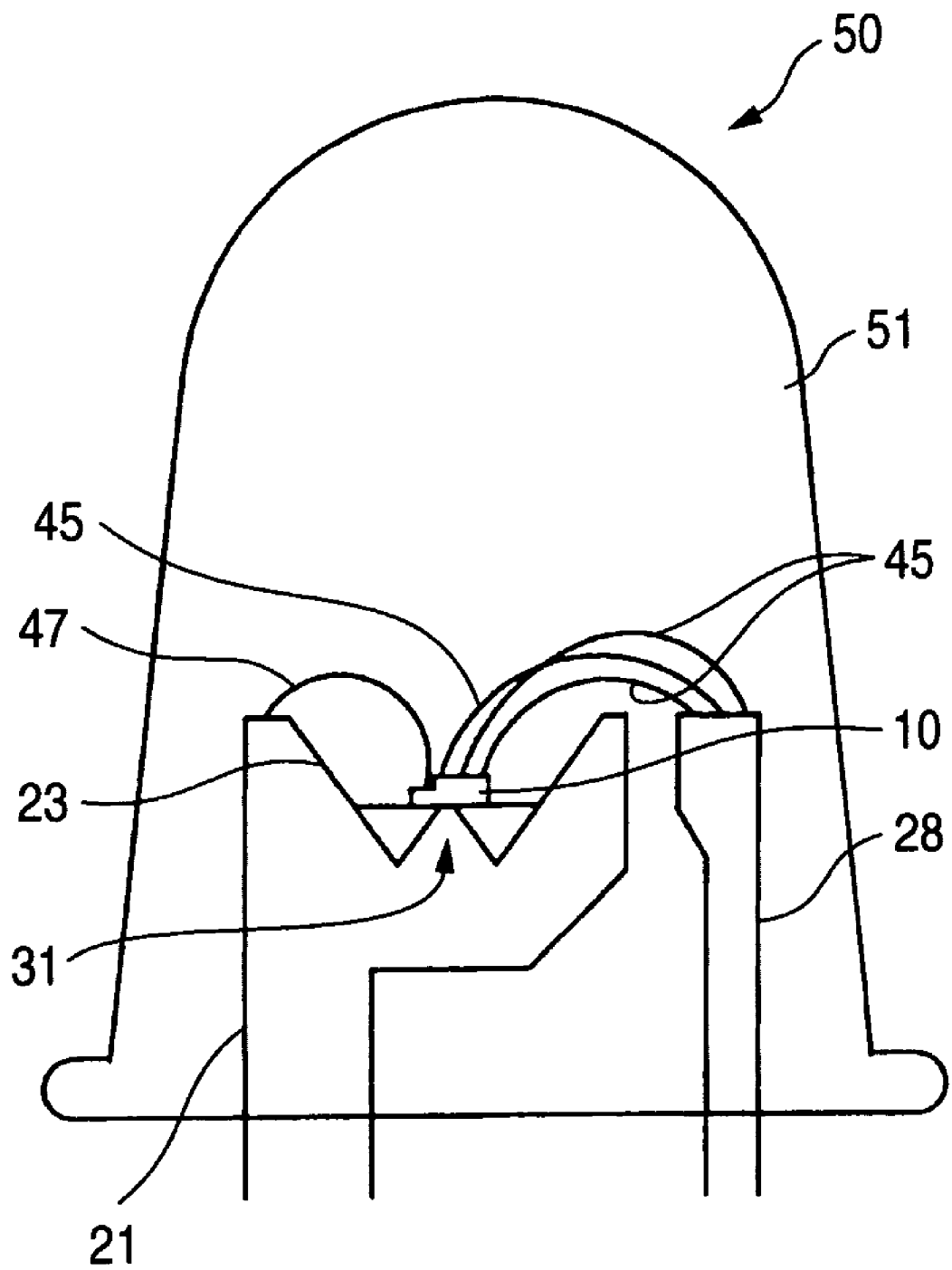
FIG. 7 is a view typically showing the configuration of a light-emitting device according to an embodiment of the invention.

FIG. 7 shows a light-emitting device 50 according to an embodiment of the invention.

In FIG. 7, the reference numeral 51 designates a sealing member for sealing the light-emitting element 10 and the leads 21 and 28. The sealing member 51 is made of a light-transmissive resin and formed into a round type.

In the light-emitting device 50 configured as described above, light emitted from the light-emitting element 10 is released exclusively to the substrate 11 side. The wavelength of all or part of the released light is changed by the fluorescent substance 35 with which the cup-like portion 23 is filled. Light emitted from the light-emitting element 10 and/or fluorescence generated from the fluorescent substance 35 is reflected by the side surface of the swollen portion 31 and the surface of the cup-like portion 23 so as to be radiated upward in FIG. 3. The light is converged by a top portion of the sealing member 51 shaped like a lens so as to be radiated at a required radiation angle.

In the light-emitting device 50, because the substrate 11 of the light-emitting element 10 is supported by the swollen portion 31, the mount stability of the light-emitting element 10 can be ensured. In addition, heat generated in the light-emitting element can be radiated through the swollen portion 31 efficiently.

When the side surface of the swollen portion 31 is formed as an inclined surface, light emitted from the light-emitting element 10 toward the swollen portion 31 side can be reflected toward the inner circumferential reflecting surface of the cup-like portion 23. When the shape of the inclined surface of the swollen portion 31 and the shape of the inner circumferential surface of the cup-like portion 23 are adjusted suitably, orientation characteristic of light radiated from the cup-like portion 23 can be controlled.

Figure 8:
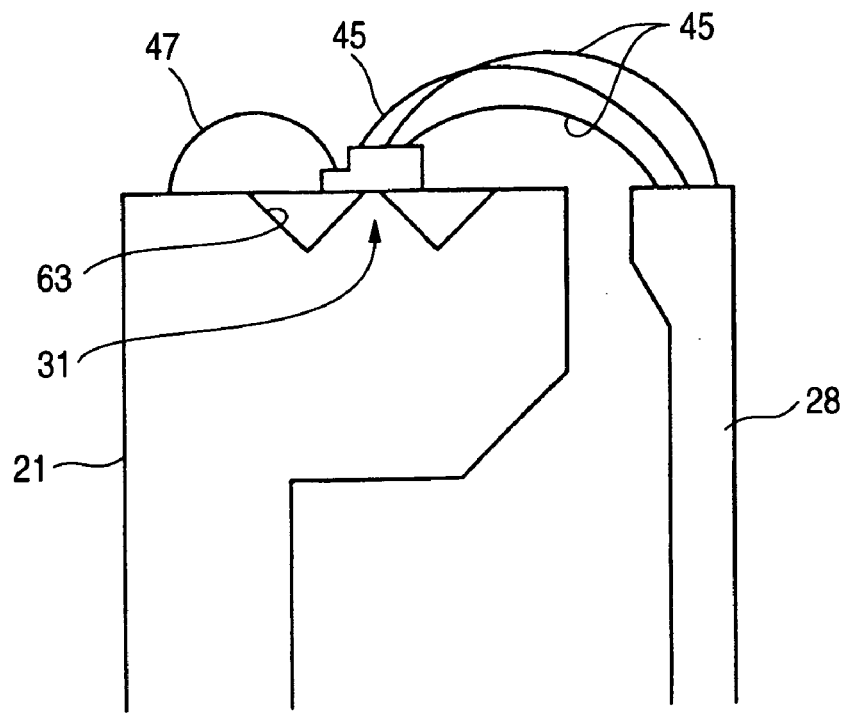
FIG. 8 is a sectional view showing a mount lead according to another embodiment of the invention.

FIG. 8 shows another embodiment of the invention. In FIG. 8, parts the same as those in FIG. 3 are denoted by the same reference numerals as those in FIG. 3, and the description of the parts will be omitted.

In the embodiment shown in FIG. 8, the cup depth in a cup-like portion 63 of the mount lead 21 is made as small as possible while the height of a circumferential edge portion of the cup-like portion 63 is made substantially equal to the height of the swollen portion 31. Even in the case where the cup-like portion 63 is made shallow in this manner, light emitted from the light-emitting element 10 can be captured by the inner circumferential reflecting surface of the cup-like portion 63 so as to be utilized efficiently because the light is released exclusively to the substrate side (i.e., from the lower side of the element).

Because the cup-like portion 63 is made shallow, the production cost of the mount lead can be reduced. Accordingly, an inexpensive light-emitting device can be provided.

Figure 9:
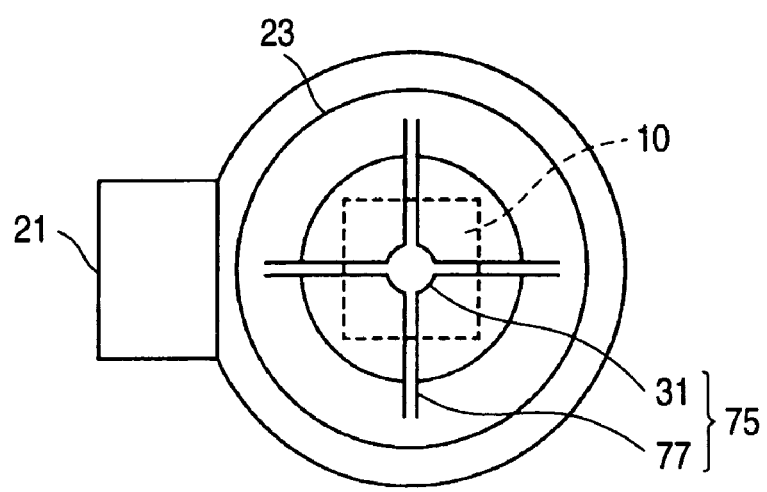
FIG. 9 is a plan view showing the configuration of a swollen portion according to another embodiment of the invention.

FIG. 9 shows a swollen portion 75 in a further embodiment of the invention. In FIG. 9, parts the same as those in FIG. 4 are denoted by the same reference numerals as those in FIG. 4, and the description of the parts will be omitted. In this embodiment, the swollen portion 75 is formed so that reinforcing walls 77 shaped like a cross are added to the swollen portion 31 shown in FIG. 4. Top portions of the reinforcing walls 77 are on the same plane with the top portion of the swollen portion 31. Accordingly, the light-emitting element 10 is supported by the respective top potions of the reinforcing walls 77 and the swollen portion 31, so that mount stability is improved. The reinforcing walls 77 are preferably provided at regular intervals (of a predetermined circumferential angle) around the center axis of the swollen portion 31. This is for the purpose of keeping balance in supporting the light-emitting element. In addition, because portions of the reinforcing walls 77 disturb reflection of light, balance of reflected light can be kept when the reinforcing walls 77 are disposed at regular intervals.

Figure 11:
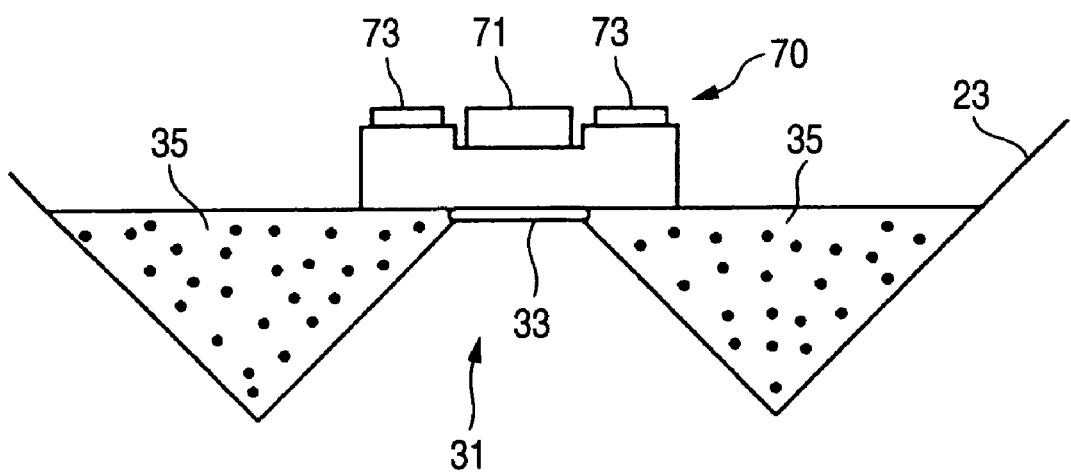
FIG. 11 is a sectional view showing a state in which the light-emitting element depicted in FIG. 10 is mounted.

FIG. 10 shows a light-emitting element 70 in a further embodiment of the invention. The light-emitting element 70 is formed so that an n electrode 71 is formed in the center portion of the light-emitting element 70 whereas a p electrode 73 is annularly formed around the n electrode 71. The reference numerals 75 and 77 designate bonding balls. As shown in FIG. 11, the light-emitting element is supported by the swollen portion 31 at the center portion of the substrate (the portion of the n electrode 71 as a region not contributing to light emission). Accordingly, it is a matter of course that the light-emitting element can be mounted stably. Furthermore, light-extracting efficiency can be improved because light emitted from the light-emitting element 70 is not blocked with the swollen portion at all. In addition, because the swollen portion 31 is located on the position of the center of gravity of the p electrode 73 (light-emitting region), light released from the substrate can be reflected evenly in all directions by the side surface of the swollen portion 31, so that balance of reflected light in the cup-like portion 23 can be kept.

The invention is not limited to the description of mode for carrying out the invention and the description of embodiments at all. Various modifications that can be easily conceived by those skilled in the art may be included in the invention without departing from the scope of claim for a patent.

What is claimed is:

1. A light-emitting device comprising:
   a semiconductor light-emitting element comprising:
     a substrate surface, a surface of which being a main light-extracting surface;
     a light-emitting layer formed on said substrate; and
     a reflective p-type electrode formed on said light-emitting layer; and
   a mount frame on which said semiconductor light-emitting element is mounted and which comprises a reflecting portion for reflecting light emitted from said substrate surface,
   wherein said mount frame comprises a swollen portion formed within said reflecting portion such that a part of said substrate surface is supported by said swollen portion to thereby mount said light-emitting element on said mount frame, said swollen portion comprising a substantially flat top surface to support said substrate surface.

2. A light-emitting device according to claim 1, wherein said swollen portion is formed so as to be integrated with said mount frame.

3. A light-emitting device according to claim 1, wherein said swollen portion comprises a rotationally symmetric member protruded from nearly the center of a bottom surface of said reflecting portion of said mount frame.

4. A light-emitting device according to claim 3, wherein said swollen portion comprises an inclined surface.

5. A light-emitting device according to claim 1, wherein said swollen portion supports substantially the position of the center of gravity of said substrate surface.

6. A light-emitting device according to claim 1, wherein said swollen portion supports substantially the position of the center of gravity of said p-type electrode of said light-emitting element.

7. A light-emitting device according to claim 1, wherein said swollen portion supports a surface below an n electrode in said light-emitting element.

8. A light-emitting device according to claim 1, wherein a plurality of bonding wires are connected to said p-type electrode of said light-emitting element.

9. A light-emitting device according to claim 1, where said semiconductor light-emitting element comprises a Group III nitride compound semiconductor light-emitting element.

10. A light-emitting device according to claim 1, wherein said swollen portion comprises substantially cross-shaped reinforcing walls.

11. A light-emitting device according to claim 1, further comprising:
    an n electrode brined in a center portion of the light-emitting element,
    wherein said p-type electrode is formed annularly around the n electrode.

12. A light-emitting device according to claim 1, wherein light released from said substrate is reflected uniformly in all directions by a side surface of said swollen portion.

13. A light-emitting device according to claim 1, wherein said swollen portion is integrally formed with said mount frame.

14. A light-emitting device according to claim 1, wherein said swollen portion comprises a same material as said mount frame.

15. A light-emitting device according to claim 1, wherein said swollen portion is formed separately from said mount frame.

16. A light-emitting device according to claim 15, wherein said swollen portion comprises a metal material having a high thermal conductivity.

17. A light-emitting device according to claim 1, wherein said swollen portion comprises a rotationally symmetric member disposed substantially at a center of said reflecting portion.

18. A light-emitting device according to claim 1, wherein said swollen portion comprises an inclined surface.

19. A light-emitting device according to claim 11, wherein said swollen portion is disposed below said n electrode.

20. A light-emitting device according to claim 1, wherein said swollen portion contacts said substrate surface.

21. A light-emitting device according to claim 1, wherein said swollen portion has a shape of a truncated cone.

22. A light-emitting device according to claim 1, wherein less than an entirety of said substrate surface is supported by said swollen portion.

23. A light-emitting device according to claim 1, wherein light is released exclusively from said substrate surface.

24. A light-emitting device according to claim 1, wherein a height of said mount frame is substantially equal to a height of said swollen portion.

25. A light-emitting device according to claim 1, wherein said semiconductor light-emitting element comprises an electrode which reflects light in a direction of said swollen portion.

26. A light-emitting device according to claim 1, wherein said p-type electrode comprises a metal selected from the group consisting of Rh, Pt, Ru or an alloy of said metal.

27. A light-emitting device according to claim 1, wherein said light-emitting element comprises a flip-chip type light-emitting element.

* * * * *